United States Patent [19]

Ogawa et al.

[11] Patent Number: 4,942,379

[45] Date of Patent: Jul. 17, 1990

[54] SUPERCONDUCTOR FOR MAGNETIC FIELD SHIELD

[75] Inventors: Souichi Ogawa; Takao Sugioka; Masaru Inoue, all of Osaka, Japan

[73] Assignees: Osaka Prefecture; Koatsu Gas Kogyo Co., Ltd., both of Osaka, Japan

[21] Appl. No.: 416,712

[22] Filed: Oct. 3, 1989

[30] Foreign Application Priority Data

Oct. 3, 1988 [JP] Japan .................. 63-250546

[51] Int. Cl.⁵ .............................................. H01F 7/22
[52] U.S. Cl. ................................. 335/301; 335/216; 324/318
[58] Field of Search ................. 335/216, 301, 304; 324/318, 319, 320

[56] References Cited

U.S. PATENT DOCUMENTS 4,851,799 7/1989 Hilal .................................. 335/301
4,890,082 12/1989 Fujita ............................... 335/301

FOREIGN PATENT DOCUMENTS

0190767 8/1986 Japan ................................ 335/301

Primary Examiner—George Harris
Attorney, Agent, or Firm—Koda & Androlia

[57] ABSTRACT

A superconductor for magnetic field shield comprising closed-ring disc-shaped superconductive magnetic field shielding members and spacing members having the same shape as that of the magnetic field shielding member and alternately laminated with the shielding members, the superconductor for magnetic field shield being characterized in that the shield has an extremely superior and stable magnetic field shielding effect without any secular reduction of the shielding effect and capable of providing a large shielding space using a minimum amount of material.

9 Claims, 4 Drawing Sheets

Applied magnetic field

FIG. 1

Applied magnetic field

SUPERCONDUCTOR FOR MAGNETIC FIELD SHIELD

BACKGROUND OF THE INVENTION

1. Field of the Invention

The present invention relates to a superconductor for magnetic field shield which shields magnetic fields using superconductive materials.

2. Prior Art

As a magnetic field shield utilizing superconductivity, the first class superconductor or the second class superconductor has been used depending on the intensity of a magnetic field. The magnetic field shield using the first class superconductor utilizes perfect diamagnetism (Meissner effect), a characteristic of superconductivity. This magnetic field shield cannot shield intense magnetic fields since its critical magnetic flux density is low. The magnetic field shield using the second class superconductor utilizes the above-mentioned perfect diagmagnetism and the diamagnetism obtained by a mixture of the superconductor state and the normal conduction state. The critical magnetic field is separated into the upper and lower critical magnetic fields. Since the intensity of the upper critical magnetic field is extremely high, the magnetic field shield using the second class superconductor can be used to shield intense magnetic fields.

Superconductivity shielding and electromagnetic shielding are used to shield magnetic fields using superconductors. Superconductive shielding uses the perfect diamagnetism (a characteristic of superconductivity) and the diamagnetism obtained by the above-mentioned mixture condition. In the case of electromagnetic shielding, what is called interlinkage magnetic flux unchangeability principle is used to generate magnetic fluxes, the direction of which is opposite to that of the magnetic fluxes interlinking in a closed circuit obtained by connecting conductors one after another.

As a magnetic field shielding application example of the above-mentioned second class superconductor, a superconductive sheet or tape wound around a cylindrical core material is used. An example of this type is disclosed as the Japanese Provisional Patent Publication No. 56-40289. This magnetic field shield is disposed in an intense magnetic field to shield the internal space of the core material against external magnetic fields, or used to prevent the magnetic field of a magnet disposed in the core material from leaking outside.

The U.S. Pat. No. 3,281,738 discloses a superconductive solenoid. In this superconductive solenoid, discs on which superconductive rings are formed coaxially and discs made of a material superior in thermal and electrical conductivity are laminated alternately to form a cylinder. This cylinder is intended to be used as a magnet by taking magnetic fluxes inside. It can also be used as a magnetic field shield since it contains superconductors between the internal and external spaces.

The shield composed of a cylindrical core material on which the above-mentioned superconductive sheet or tape is wound is used to electromagnetically shield the internal and external sides of the core material via the junction at the ends of the superconductive sheet or the junctions at the fringes of the superconductive tape. Therefore, the junction condition greatly affects the magnetic field shielding effect. The above-mentioned Japanese Patent Provisional Publication discloses a mehtod wherein a superconductive sheet is wound around a core material and dipped in a melted metal (with a low melting point) to join the fringes of the superconductive tape. In this case, however, the melted metal is not fully distributed and the thickness of the metal layer is not uniform. As a result, the shield has a low shielding effect to a magnetic field parallel to the axis of the core material and the effect reduces secularly. When the shielding effect on the surface area of the shield to a magnetic field is examined, no electrical interlinkage condition by the superconductive tape is not formed since the low melting point metal discontinues at some portions. The interlinkage magnetic flux unchangeability principle cannot function sufficiently. In addition, differences in electrical resistance are caused due to differences in thickness of the low melting point metal. At a thick portion, Joule heat generates and the electrical interlinkage condition is apt to be lost secularly.

As another example, a net tape including a superconductive wire material is wound on a cylindrical core material and joined using Wood's metal or solder. This shield has numerous junctions and its magnetic field shielding effect reduces secularly due to the electrical resistance generated at the junctions.

When the superconductive solenoid of the above-mentioned U.S. Patent is used as a magnetic field shield, it is estimated to be superior to the above-mentioned shield in the shielding stability and secular shielding characteristics. The superconductive disc of the solenoid is made by coating numerous coaxial rings (ring width: 0.02 to 0.16 cm) of a superconductive material (NbTi for example) on at least one side of a metal substrate. The ring width is set to 0.16 cm or less. If it exceeds 0.16 cm, eddy current generates and the intensity of the magnetic field to be trapped is reduced. The multiple coaxial rings formed on the disc ensure the total magnetic field trap amount for a single superconductive disc. When the disc is examined in the viewpoint of magnetic field shielding, the narrow width of the superconductive material reduces the magnetic field shielding effect. Therefore, a large structure is required to obtain even a small shielding space. Accordingly, the above-mentioned superconductive solenoid is hardly applicable to a magnetic field shield. The superconductive discs and the above-mentioned metal discs are alternately laminated. Because grooves are present between the superconductive rings, magnetic fluxes enter via the metal discs and grooves when the thickness of the metal discs is increased. To prevent this problem, the thickness of metal discs should be as small as possible. However, when thin discs are used in a magnetic field shield, the proper shielding space of a shield structure cannot be adjusted easily depending on the size of the object to be shielded.

SUMMARY OF THE INVENTION

After carefully examining the secular reduction of the magnetic field shield effect due to the presence of junctions, effective shielding, and formation of effective spaces and machinability of effective shielding spaces in the above-mentioned magnetic field shield, the inventors of the present invention completed a superconductor for magnetic field shield extremely superior and stable in magnetic field shielding effect without causing any secular reduction of the effect and capable of forming a large shielding space using a minimum amount of materials and disclose the invention herein. The applicants of the present invention have already disclosed superconductors for magnetic field shield featuring superior magnetic field shielding functions in the Japanese Patent Application Nos. 60-024254, 62-68499 and 63-200795. It is therefore an object of the present invention to form an extremely effective shielding space using these superconductors for magnetic field shield.

DETAILED DESCRIPTION OF THE INVENTION

The structure of the present invention is explained below referring to the attached drawings. The superconductor for magnetic field shield of the present invention comprisess closed-ring disc-shaped superconductive magnetic field shielding members 1 and disc-shaped spacing members 2 having the same shape as that of the magnetic field shielding member 1 and alternately laminated with the shielding members 1, the superconductor for magnetic field shield being characterized in that the shielding member 1 is comprised of a superconductive layer 3 having a thickness of 500 $\mu$m or less and closely laminated with metal layers 4 having superior thermal and electrical conductivity and that the ring width of the superconductive layer 3 is 2 mm or more.

Figure 1:
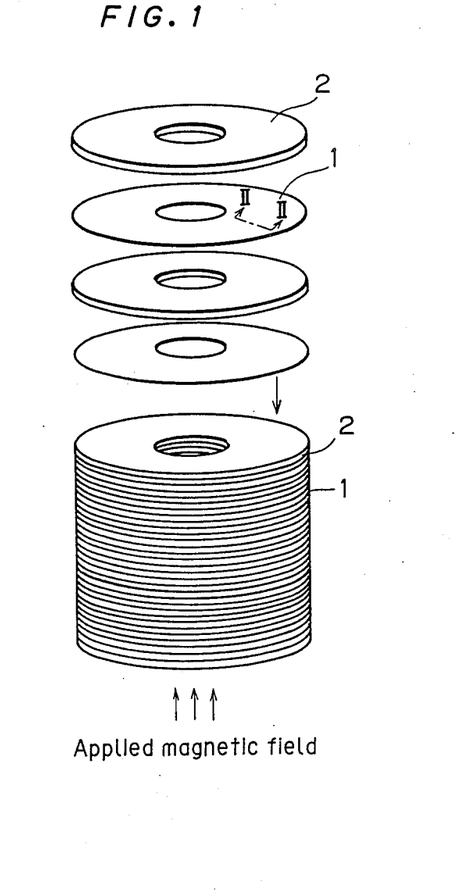
FIG. 1 is a partially exploded perspective view illustrating a superconductor for magnetic field shield of the present invention.
Figure 2:
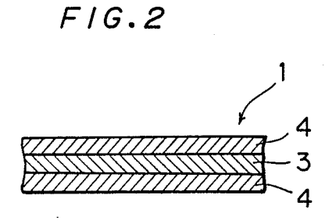
FIG. 2 is an enlarged sectional view taken on line II—II of FIG. 1.
Figure 3:
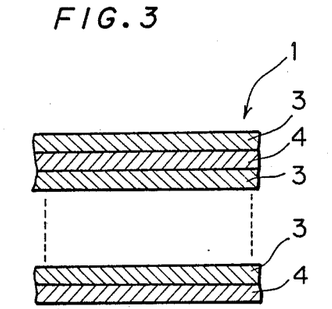
FIGS. 3 to 6 are views of other embodiments of the present invention similar to FIG. 2.

The superconductor for the shielding member 1 includes one to several tens of superconductive layers. When only one superconductive layer 3 is used, it is closely laminated with two metal layers 4 on both sides of the superconductive layer 3 (as shown in FIG. 2). When two or more superconductive layers 3 are used, it is necessary that the metal layers 4 are closely inserted between at least two superconductive layers 3 (as shown in FIG. 3). The close mutual lamination of the superconductive layers 3 and the metal layers 4 are usually made by sputtering or electrodeposition of metal on a superconductive sheet. When a plurality of the electrodeposited composites are laminated, they are dipped in a low-point melting metal bath and compressed.

The superconductive layer 3 is made of niobium, niobium compound, niobium alloy, vanadium compound or vanadium alloy. More specifically, Nb, Nb-Ti alloy, Nb-Zr alloy, NbN, NbC, NbN.TiN (mixed crystal proposed in the Japanese Patent Application No. 63-200795), $Nb_3Sn$, $Nb_3Al$, $Nb_3Ga$, $Nb_3Ge$, $Nb_3(AlGe)$ or $V_3Ga$ is used. In addition, ceramic-based superconductive material (for example, Ba-Y-Cu-O based compound, La-Sr-Cu-O based compound, Bi-Sr-Ca-Cu-O based compound and Tl-Ba-Ca-Cu-O based compound) or Chevrel superconductive material (for example, $PbMo_6S_6$) is also used.

The thickness of the superconductive layer 3 is set to 500 $\mu$m or less so that the cooling and stabilization effect by the metal layer 4 is obtained effectively. According to the relationship between the thickness of the superconductive layer and the magnetic field shielding effect disclosed in the Japanese Patent Application No.60-024254 (Japanese Patent Provisional Publication No. 61-183979), the magnetic field shielding effect abruptly increases from the vicinity of the origin of the graph indicating the relationship and then gradually increasess as the thickness of the superconductive layer increases. If the thickness of the superconductive layer is less than that corresponds to the turning point where the above-mentioned abrupt increase of the shielding effect shifts to the gradual increase, the magnetic field shielding effect by the multiple layers of the superconductive layers increases synergetically. This is highly desirable to increase the shielding effect.

The ring width of the superconductive layer 3 is set to 2 mm or more to generate eddy current on the ring of the superconductive layer 3 so that the perfect diamagnetism and the diamagnetism are caused by the eddy current. In other words, if the ring width of the layer 3 is below 2 mm, the above-mentioned eddy current is not generated suffieicently and the magnetic field shielding effect due to the perfect diamagnetism and the diamagnetism are apt to reduce. It is also difficult to produce such superconductive layers. There is no upper limit in the width of the ring. The greater the width, the larger the shielding current capable of flowing in the superconductive layer 3 and the higher the shielding effect.

Figure 4:
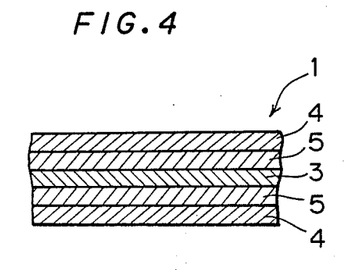

When the superconductive layer 3 is primarily comprised of a mixed crystal body of niobium nitride and titanium nitride [$NbN_x.TiN_{1-x}(0.1 \leq x < 1)$], a Nb-Ti alloy layer 5 should be sandwiched between the metal layer 4 and the superconductive layer 3 (as shown in FIG. 4), since NbN.TiN has no affinity with the metal layer 4. The Nb-Ti alloy layer 5 which has good affinity with the layers 3 and 4 are sandwiched between the layers to ensure firm fixture of the layers. Since the metal layer 4 functions to cool the superconductive layer 3, it must be closely laminated with the superconductive layer 3 and should be made of a metal superior in thermal and electrical conductivity, such as copper, aluminum, nickel, stainless steel, titanium, niobium or niobium-titanium alloy.

Figure 5:
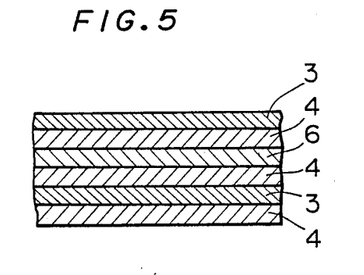

With the superconductive magnetic field shielding member 1, the superconductive layer 3 must be closely laminated with the metal layer 4. When two or more superconductive layers 3 are used, it is possible to include a dielectric layer 6 which is superior in thermal conductivity and made of ceramic, such as aluminum nitride, cubic boron nitride, silicon carbide or silicon nitride, or diamond in the layers (as shown in FIG. 5). By including the dielectric layer 6, the superconductive layer 3 is electrically insulated and the stabilization effect is further enhanced.

As a result, the magnetic field shielding effect by lamination is further magnified. The dielectric layer 6 is thus desirably used.

Figure 6:
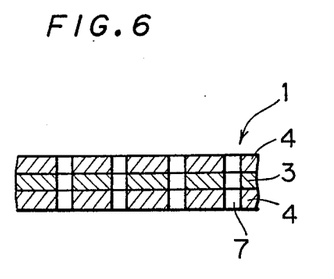

The magnetic field shielding member 1, a closed-ring disc, can have a plurality of small holes 7 passing through the disc in the direction of the thickness (as shown in FIG. 6). These small holes 7 feature electromagnetic shielding as disclosed in the Japanese Patent Application Nos. 62-068499 and 63-200795. The area of the small holes 7 should be 3 $cm^2$ or less and the open area rate of the entire area to the holes 7 should be 90% or less. If the area exceeds 3 $cm^2$ and the open area rate exceeds 90%, the strenght of the laminated layers is insufficient when subjected to stress during handling in an intense magnetic field, and the area of the superconductive layer 3 becomes smaller.

This reduces shielding current (which flows to generate a magnetic field used to cancel the environmental magnetic field) required to shield an intense magnetic field. In addition, if the area of the small hole exceeds 3 cm$^2$, the magnetic field for shielding inside each small hole has an inclination. preventing complete shielding at each small hole. In the other hand, if the area of the small hole is too small, clogging is apt to occur during sputtering.

The spacing member 2 is used to provide a proper distance in the lamination of the superconductive magnetic field shielding members 1, and composed of aluminum, cooper or synthetic resin, such as epoxy resin. The shielding members 1 are laminated with the spacing members 2 using an external frame made of non-magnetic material for example. When a plurality of layers are laminated, the shielding members 1 are alternately laminated with the spacing members 2, or a plurality of units comprising a plurality of the shielding members 1 are alternately laminated with the spacing members 2.

Figure 7:
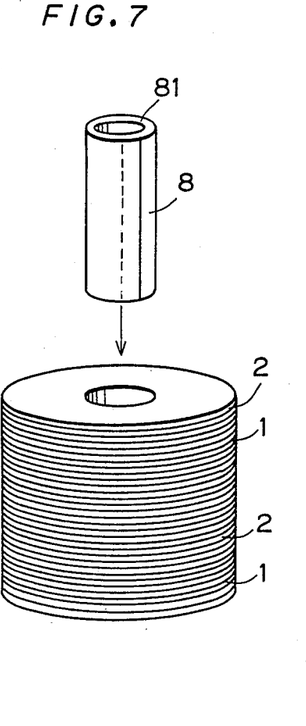
FIGS. 7 and 8 are perspective views of another embodiment of the present invention.
Figure 8:
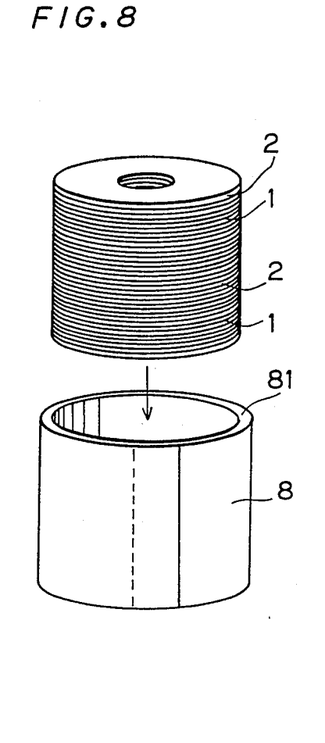

Moreover, as an additional embodiment of the present invention, it is possible to coaxially insert a metallic cylinder 8, the exterior of which is coated with a superconductive sheet or film 81, into the central open space of the laminated superconductive shielding members 1 and the spacing members 2 (as shown in FIG. 7). It is also possible to insert the laminated superconductive shielding members 1 and the spacing members 2 into the metallic cylinder 8 (as shown in FIG. 8). When only the above-mentioned lamination structure is used, it has a relatively low shielding effect to magnetic fields perpendicular to the axis of the structure, although it has a superior shielding effect to magnetic fields parallel to the axis. The additional embodiment is used to compensate for this deficit.

The above-mentioned superconductive materials can be used for the superconductive sheet or film 81. When joining the superconductive materials with the metallic cylinder 8 and when joining the superconductive materials with each other, a commercially available adhesive can be used as well as a pressure joining method using a low melting point metal. When winding a wide superconductive sheet or tape, it is not absolutely necessary to join the leading end with the trailing end of the sheet or tape, because the lamination structure can fully shield magnetic fields generated in parallel to the axis. Because of the same reason, both ends of the cylinder 8 can be opened.

The functions of the superconductor for magnetic field shield of the present invention are detailed below. When the superconductor for magnetic field shield structure is disposed in a magnetic field which is parallel to the axis of the structure, shielding current is generated by the magnetic field which is parallel to the axis. This shielding current flows in the shielding member 1 and prevents the magnetic field from passing through. At this time, the superconductive layer 3 in the shielding member 1 is a complete closed loop and has no junction. Therefore the shielding effect is maintained secularly.

The superconductive layer 3 of the shielding member 1 has the Meissner effect (perfect diamagnetism) and the diamagnetism in the mixed condition of the superconduction and normal conduction. In other words, the magnetic field is repulsed by these inherent characteristics of the superconductive member and is prevented from passing. When a plurality of the shielding members 1 are laminated, the above-mentioned two shielding effects are combined and the magnetic field is shut off by the shielding members 1 one after another. As a result, the magnetic field is completely prevented from passing into the space inside the object to be shielded.

As described above, the shield of the present invention uses a combination of superconductive shielding and electromagnetic shielding. The superconductive layer 3, a major element of magnetic field shielding, is closely laminated with the metal layer 4 which is superior in thermal and electrical conductivity, and the shielding effect is stablilized by the cooling effect of the metal layer 4.

Therefore, the magnetic field shielding effect is enchanced by increasing the number of the shielding members 1 and/or the superconductive layers 3 and by increasing the ring width of the superconductive layer 3. Since the shielding members 1 are laminated with the spacing members 2, the magnetic field shielding effect can be adjusted as desired by selecting the thickness and the number of the spacing members 2. Furthermore, the size of the internal space in the shield can also be adjusted depending on the size of the object or magnet to be shielded.

When the small holes 7 passing through the magnetic field shielding member 1 and the spacing members 2 are provided in the direction of the thickness, electromagnetic shielding is produced at the small hole sections and superconductive shielding is produced at the other sections using the complete diamagnetism and the above-mentioned mixed-condition diamagnetism. In other words, the electromagnetic shielding effect by the small holes 7 is added to the above-mentioned superconductive shielding effect, further increasing the magnetic field shielding effect.

When the shield comprising the metallic cylinder 8 externally coated with the superconductive sheet or film 81 and inserted in the central space of the laminated structure or the shield comprising the laminated structure inserted into the metallic cylinder 8 is placed where it is subjected to a magnetic field perpendicular to the axis of the structure, the superconductive sheet or film 81 coated over the metallic cylinder 8 shuts off the perpendicular magnetic field. This effect is combined with the above-mentioned magnetic field shielding effect to produce three-dimensional magnetic field shielding.

(EMBODIMENTS)

[I] Using a sputtering unit equipped with a take-up mechanism, superconductive layers made of NbTi were alternately laminated with metal layers made of Cu on an aluminum substrate measuring 15 μm in thickness and several meters in length. As such laminated structures, the following types were prepared: a single layer type including a 2 μm thick NbTi layer and another single layer type including a 4 μm thick NbTi layer (the NbTi layer was sandwiched between the aluminum substrate and the Cu layer), two-layer types including two 2 μm thick layers (the NbTi layer, Cu layer and NbTi layer were laminated on the aluminum substrate in that order) and a three-layer type including three layers (the NbTi layer, Cu layer, NbTi layer, Cu layer and NbTi layer were laminated on the aluminum substrate in that order). These laminations were cut into discs measuring 35 mm in diameter and provided with a 10 mm diameter hole at the center. These were used as the superconductive shielding members (embodiments 1 to 7) of the present invention. The aluminum substrate was used as the metal layer of the present invention.

[II] The NbTi and Cu layers were laminated on the aluminum substrate inside a sputtering unit similar to that described above. On the lamination, nitride alumina ceramic was formed by the reactive sputtering method in the atmosphere of argon and nitrogen gases using aluminum as a target. On the aluminum nitride layer, the Cu and NbTi layers were formed in the same manner as described above. This was used as another superconductive shielding member (embodiment 8).

[III] Using the sputtering method similar to that described above, small holes measuring 50 μm in diameter were provided in a Cu substrate at an open area rate of 20%. On the Cu substrate, NbTi superconductive layers and Cu metal layers were alternately laminated. In this case, five 4 μm NbTi layers were used. Each Cu layer was sandwiched between two NbTi layers. A Cu layer was placed on the top. This lamination was cut into a closed-ring disc as described above to form another superconductive shielding member (embodiment 9). The Cu substrate was used as the metal layer of the present invention.

[IV] The NbTi superconductive layer was rolled into a specified thickness. As a metal layer, Cu was coated over the entire surface of the NbTi layer by electrodeposition. In this case, 50 μm and 300 μm thick NbTi layers were used. These composites coated with the Cu layer by electrodeposition were laminated (three layers in the case of the 50 μm thick NbTi layers and two layers in the case of the 300 μm thick NbTi layers), dipped in a low melting point metal bath and integrated by compression. These were cut into discs in the same manner as described above and were used as superconductive shielding members (embodiments 10 and 11).

[V] Aluminum plates measuring 0.16, 0.5, 1 and 3 mm in thickness were cut into closed-ring discs measuring 35 mm in outer diameter and 10 mm in central inner diameter. These were used as spacing members of the present invention.

[VI] The superconductive shielding members and spacing members prepared as described above were laminated and secured using an external frame made of non-magnetic substance. These were used as magnetic field shields.

The shielding members used for embodiments 3, 4, 5 or 7 were cut into discs measuring 35 mm in outer diameter. In the center of these discs, holes measuring 10, 15, 20, 25 and 30 mm in inner diameter were provided (one hole in each disc). These were used as experiment samples 1 5.

The cylindrical shields (embodiments 1 11) prepared as described above are placed in a magnetic field which is parallel to the axes of the shields. The magnetic force in each hollow cylinder was measured and the magnetic field shielding amount (the intensity of the applied magnetic field minus the intensity of the measured magnetic field) was calculated. The results depending on the lamination structure are listed in Table 1.

Experiment samples 1 to 5 were exposed to a magnetic field which is perpendicular to the sample surface. The maximum magnetic field shielding amount was measured at the center of each sample and calculated in the same manner as described above. The results are listed in Table 2.

TABLE 1

| Embodiment No. | Shielding member Layer thickness & layers | Qty | Spacing member Thickness (mm) | Qty | Height of shield (mm) | Shielding amount (Gauss) |
|---|---|---|---|---|---|---|
| 1 | 2 μm, 1 | 30 | 1 | 30 | 30 | 1,450 |
| 2 | 4 μm, 1 | 30 | 1 | 30 | 30 | 1,980 |
| 3 | 2 μm, 2 | 60 | 0.5 | 60 | 30 | 4,480 |
| 4 | 2 μm, 2 | 30 | 3 | 30 | 90 | 1,720 |
| 5 | 2 μm, 2 | 90 | 1 | 30 | 30 | 5,690 |
| 6 | 2 μm, 3 | 30 | 1 | 30 | 30 | 3,600 |
| 7 | 2 μm, 2 | 180 | 0.16 | 180 | 30 | 12,000 |
| 8 | 2 μm, 2 | 60 | 0.5 | 60 | 30 | 4,600 |
| 9 | 4 μm, 5 | 30 | 1 | 30 | 30 | 8,200 |
| 10 | 50 μm, 3 | 30 | 1 | 30 | 40 | 6,300 |
| 11 | 300 μm, 2 | 30 | 0.5 | 30 | 50 | 7,200 |

The magnetic field shielding amounts listed in Table 1 represent the maximum magnetic field shielding amounts obtained at the respective centers of the shields. In the case of the embodiments 1 to 9, the thickness of the shield is regarded to be nearly equal to the total thickness of the spacing members since the thickness of the shielding member is negligible.

TABLE 2

| Experiment No. | I.D. of shielding member (mm) | Ring width of superconductive layer (mm) | Max. shielding amount (Gauss) |
|---|---|---|---|
| 1 | 10 | 12.5 | 270 |
| 2 | 15 | 10.0 | 180 |
| 3 | 20 | 7.5 | 120 |
| 4 | 25 | 5.0 | 80 |
| 5 | 30 | 2.5 | 50 |

As listed in Table 1, it is understood that all embodiments generate extremely superior magnetic field shielding effect. The thicker the superconductive layer, the greater the magnetic field shielding amount (according to the comparison of embodiments 1, 2, 9 and 10). The larger the number of shielding members and/or superconductive layers, the greater the magnetic field shielding amount (according to the comparison of embodiments 3, 4, 5, 6 and 7). The magnentic field shielding amount is further increased significantly when small holes are provided (embodiment 9).

In the case of the independent shielding members listed in Table 2, the larger the ring width of the superconductive layer, the larger the magnetic field shielding amount. This is interpreted as follows. The larger the ring width, the greater eddy current is apt to be generated. This causes the perfect diamagnetism. Therefore, it is estimated that a greater magnetic field shielding effect is obtained by laminating more shielding members having a larger ring width.

Figure 9:
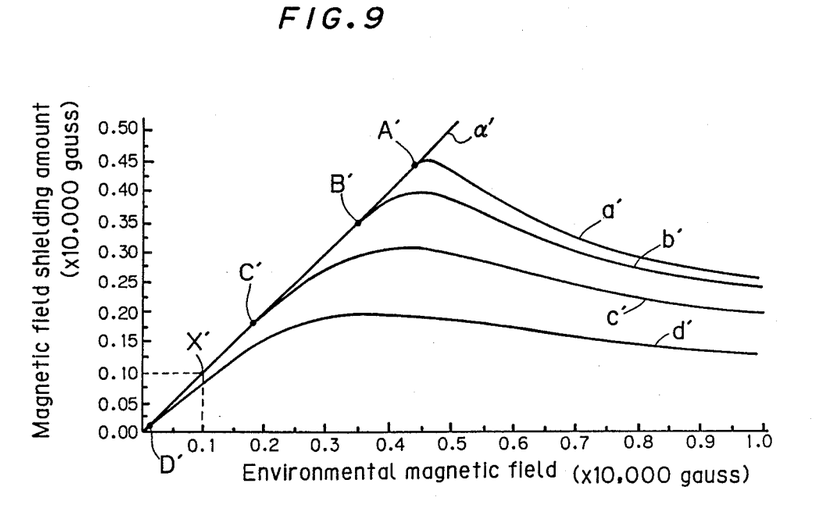
FIGS. 9 and 10 are magnetic field shielding characteristic curve graphs of the embodiments of the magnetic field shield of the present invention.
Figure 10:
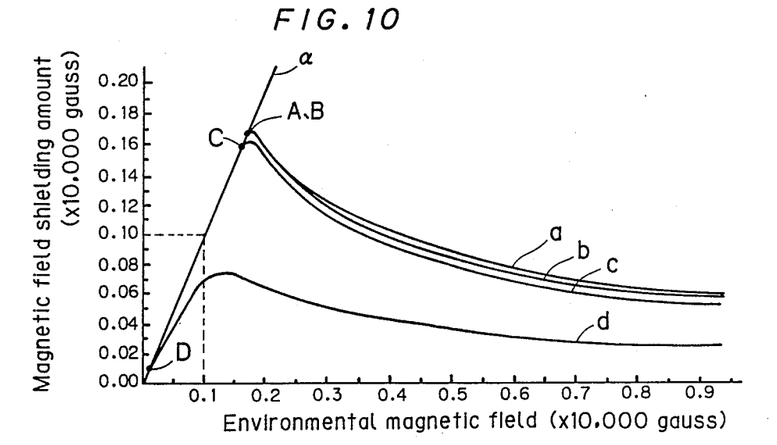

Embodiments 3 and 4 are compared as follows. The ratio of the number of shielding members of embodiment 3 to the number of shielding members of embodiment 4 is 2:1 (60 pieces:30 pieces). The ratio of the height of the shield of embodiment 3 and that of embodiment 4 is 1:3 (30 mm and 90 mm). FIGS. 9 and 10 show the magnetic field shielding characteristics of the shields of embodiments 3 and 4. The abscissa axis indicates the intensity of an environmental magnetic field and the ordinate axis indicates a magnetic field shielding amount.

Referring to FIG. 9, curves a', b', c' and d' represent the magnetic field shielding characteristics obtained at positions 0, 5, 10 and 15 mm away in both directions from the center of the shield along the axis thereof. The ends of the shields correspond to the 15 mm away positions.

Referring to FIG. 10, curves a, b, c and d represent the magnetic field shielding characteristics obtained at positions 0, 5, 30 and 45 mm away from the center of the shield along the axis thereof. The ends of the shields correspond to the 45 mm away positions. At the points on straight lines a' and a, the applied magnetic field is completely shut off.

For example, at points X' and X on the straight lines a' and a, the intensity of the environmental magnetic field is 1,000 gauss and the magnetic field shielding amount is also 1,000 gauss. Therefore, there is no entry of magnetic field at the shield positions corresponding to points A', B', C' and D' in FIG. 9 and points, A, B, C, D in FIG. 10. In other words, the intensities of the magnetic fields at these points are the maximum values to be shielded. When the magnetic field shielding amounts measured at the respective centers of the shields are compared referring to FIGS. 9 and 10, the magnetic field shielding amount of embodiment 3 is approximately 4,500 gauss and that of embodiment 4 is approximately 1,700 gauss. Embodiment 3 has a larger magnetic field shielding amount. When a shielding space is considered, however, complete shielding is possible up to a position 10 mm away from the center of the shield along the axis thereof in the environmental magnetic field having an intensity of 1,600 gauss in the case of embodiment 3. This corresponds to about 67% of the space inside the cylinder. In the case of embodiment 4, complete shielding is possible up to a position 30 mm away from the center of the shield along the axis thereof in the environmental magnetic field having an intensity of 1,600 gauss. This distance is about three times as long as that of embodiment 3.

According to this comparison, effective magnetic field shielding is possible by properly selecting the number of shielding members, the size and number of spacing members depending on the intensity of the environmental magnetic field and the size of the required shielding space.

[VII] The superconductive magnetic field shielding member similar to that (two 2 μm thick superconductive layers) used in embodiment 7 was made into a sheet of 30 mm wide. This superconductive sheet was externally wound 15 times around two different Cu pipes (one was 8 mm in outer diameter and 30 mm in lenght and the other was 35 mm in inner diameter and 30 mm in lenght) which were open at both ends. The smaller pipe was inserted into the hollow cylinder of the shield of embodiment 7. The other shield of embodiment 7 was inserted into the larger pipe. These shields were placed in environmental magnetic fields, the directions of which are parallel, perpendicular and at different angles to the axes of the shields. Their maximum magnetic field shielding amounts were over 10,000 gauss in any case. Although the shields of embodiments 1 to 10 have extremely superior magnetic field shielding effects in a magnetic field parallel to the axis, the effects to a magnetic field perpendicular to the axis are reduced slightly. Unlike embodiments 1 to 10, the embodiments described in [VII] have superior magnetic field shielding effects to magnetic fields generated in all directions and can be said to be ideal shields. Superconductive layers made of the above-mentioned materials other than those used in the embodiments were also examined and we obtained almost the same results.

As described above, with the superconductor for magnetic field shield of the present invention, the superconductive layer of the superconductive magnetic field shielding member has a shape of a completely closed ring and has no juncton. Therefore, the shielding current flowing the superconductive layer does not cause secular reduction, maintaining stable electromagnetic shielding.

As described above, superconductive shielding is performed by the Meissner effect at the superconductive layer and by the diamagnetism in the mixed condition of the superconduction and normal conduction. Since the superconductive layer is closely laminated with the metal layer superior in thermal and electrical conductivity, the cooling effect of the metal layer further stabilizes the superconductive magnetic field shielding effect. As a result, the effect is extremely stable.

Since the shielding members including superconductive layers are laminated with spacing members and the shielding effect is stable as described above, it is possible to form desired effective shielding spaces depending on the size of the object and magnet to be shielded, by properly selecting the thickness and the number of spacing members.

With the superconductor for magnetic field shield described, the electromagnetic shielding effect by small holes is added to the above-mentioned effect. With the superconductor for magnetic shield described, the metallic cylinder coated with superconductive material can shut off magnetic fields generated in all directions.

In this way, the superconductor for magnetic field shield of the present invention is highly effective in magnetic field shielding and its value is tremendous.

We claim:

1. A superconductr for magnetic field shield comprising closed-ring disc-shaped superconductive magnetic field shielding members and spacing members having the same shape as that of said magnetic field shielding member and alternately laminated with said shielding members, said superconductor for magnetic field shield being characterized in that said shielding member is comprised of a superconductive layer having a thickness of 500 μm or less and closely laminated with metal layers having superior thermal and electrical conductivity and that the ring width of said superconductive layer is 2 mm or more.

2. A superconductor for magnetic field shield according to claim 1, wherein said shielding member includes two or more superconductive layers.

3. A superconductor for magnetic field shield according to claim 1, wherein in terms of the graph indicating the relationship between the thickness and magnetic field shielding effect of said superconductive layer, said magnetic field shielding effect increases abruptly from the vicinity of the origin of said graph and than gradually increases as the thickness of said superconductive layer increases, and the thickness of said superconductive layer is less than that corresponds to the turning point where the above-mentioned abrupt increase of said shielding effect shifts to said gradual increase.

4. A superconductor for magnetic field shield according to claim 1, wherein said superconductive layer is primarily comprised of a mixed crystal body of niobium nitride and titanium nitride.

5. A superconductor for magnetic field shield according to claim 3, wherein a niobium-titanium alloy layer is sandwiched between said superconductive layer and metal layer.

6. a superconductor for magnetic field shield according to claim 1, wherein said shielding member includes a dielectric layer which is superior in thermal conductivity and made of ceramic, such as aluminum nitride, cubic boron nitride, silicon carbide and silicon nitride, and diamond.

7. A superconductor for magnetic field shield according to claim 1, wherein said shielding and spacing members have a plurality of small holes passing through in the direction of the thickness thereof.

8. A superconductor for magnetic field shield according to claim 1, wherein a metallic cylinder, the exterior of which is coated with a superconductive sheet or film, is coaxially inserted into the central space of the lamination of said shielding members and spacing members.

9. A superconductor for magnetic field shield according to claim 1, wherein the lamination of said shielding members and spacing members is coaxially inserted into a metallic cylinder, the exterior of which is coated with a superconductive sheet or film.

* * * * *